(12) United States Patent
Iyama

(10) Patent No.: US 10,903,149 B2
(45) Date of Patent: Jan. 26, 2021

(54) SEMICONDUCTOR MODULE, ELECTRIC VEHICLE, AND POWER CONTROL UNIT

(71) Applicant: FUJI ELECTRIC CO., LTD., Kanagawa (JP)

(72) Inventor: Koichiro Iyama, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/257,028

(22) Filed: Jan. 24, 2019

(65) Prior Publication Data

US 2019/0157194 A1 May 23, 2019

Related U.S. Application Data

(63) Continuation of application No. PCT/JP2018/000370, filed on Jan. 10, 2018.

(30) Foreign Application Priority Data

Feb. 6, 2017 (JP) .................. 2017-019964

(51) Int. Cl.
*H01L 23/495* (2006.01)
*H01L 29/66* (2006.01)
(Continued)

(52) U.S. Cl.
CPC ...... *H01L 23/49568* (2013.01); *H01L 23/367* (2013.01); *H01L 23/48* (2013.01);
(Continued)

(58) Field of Classification Search
CPC ............ H01L 23/49568; H01L 2924/171–173
See application file for complete search history.

(56) References Cited

U.S. PATENT DOCUMENTS 4,209,798 A * 6/1980 Beretta ............... H01L 23/3107
174/16.3
4,480,262 A * 10/1984 Butt ...................... H01L 23/047
257/659

(Continued)

FOREIGN PATENT DOCUMENTS

JP H03091016 U 9/1991
JP H11299056 A 10/1999
(Continued)

OTHER PUBLICATIONS

International Search Report for International Patent Application No. PCT/JP2018/000370, issued by the Japan Patent Office dated Mar. 6, 2018.
(Continued)

*Primary Examiner* — David A Zarneke

(57) ABSTRACT

A semiconductor module is provided to include: a plurality of semiconductor chips; a lead frame that is connected to the plurality of semiconductor chips; and a main terminal that is connected to the lead frame, wherein the lead frame has an electrical connection portion that electrically connects the plurality of semiconductor chips to the main terminal, and a heat dissipation portion that is provided to extend from the electrical connection portion. The heat dissipation portion does not extend a path of a current that flows between the main terminal and the plurality of semiconductor chips.

13 Claims, 14 Drawing Sheets

(51) Int. Cl.
*H05K 7/20* (2006.01)
*H01L 23/367* (2006.01)
*H01L 25/18* (2006.01)
*H01L 23/48* (2006.01)
*H01L 25/07* (2006.01)

(52) U.S. Cl.
CPC .............. *H01L 25/07* (2013.01); *H01L 25/18* (2013.01); *H01L 29/66325* (2013.01); *H05K 7/209* (2013.01); *H05K 7/20854* (2013.01); *H01L 2224/48091* (2013.01)

(56) References Cited

U.S. PATENT DOCUMENTS

| | | | | |
|---|---|---|---|---|
| 5,248,895 | A * | 9/1993 | Nakazawa | H01L 23/49568 257/668 |
| 5,305,179 | A * | 4/1994 | Sono | H01L 23/49555 361/718 |
| 5,365,106 | A * | 11/1994 | Watanabe | H01L 23/49537 257/669 |
| 5,444,294 | A * | 8/1995 | Suzuki | H01L 23/49537 257/666 |
| 5,518,684 | A * | 5/1996 | Pruitt | H01L 21/4821 419/66 |
| 5,581,118 | A * | 12/1996 | Mays | H01L 21/4842 257/666 |
| 5,644,164 | A * | 7/1997 | Roh | H01L 23/4951 257/712 |
| 5,703,398 | A * | 12/1997 | Sono | H01L 21/565 257/666 |
| 5,889,658 | A * | 3/1999 | Sullivan | G01P 1/023 257/692 |
| 5,896,269 | A | 4/1999 | Autry | |
| 5,986,336 | A * | 11/1999 | Tomita | H01L 23/3107 257/675 |
| 6,396,133 | B1 * | 5/2002 | James | H01L 23/49568 257/675 |
| 6,828,667 | B2 * | 12/2004 | Yamasaki | H01C 1/144 257/690 |
| 6,949,838 | B2 * | 9/2005 | Brand | B29C 45/14655 257/685 |
| 7,582,951 | B2 * | 9/2009 | Zhao | H01L 23/3128 257/660 |
| 7,755,179 | B2 * | 7/2010 | Carney | H01L 24/40 257/686 |
| 7,902,644 | B2 * | 3/2011 | Huang | H01L 21/6835 257/659 |
| 2006/0131734 | A1 * | 6/2006 | Kummerl | H01L 23/49537 257/706 |
| 2007/0228413 | A1 | 10/2007 | Bayerer | |
| 2008/0246130 | A1 * | 10/2008 | Carney | H01L 23/49562 257/675 |
| 2013/0056885 | A1 * | 3/2013 | Minamio | H01L 23/29 257/796 |
| 2017/0006721 | A1 | 1/2017 | Soyano | |
| 2017/0042053 | A1 | 2/2017 | Soyano | |
| 2017/0154834 | A1 * | 6/2017 | Tonedachi | H01L 25/115 |
| 2019/0295932 | A1 * | 9/2019 | Nakata | H01L 23/49562 |

FOREIGN PATENT DOCUMENTS

| | | |
|---|---|---|
| JP | 2004363295 A | 12/2004 |
| JP | 2006287112 A | 10/2006 |
| JP | 2007266608 A | 10/2007 |
| JP | 2012212713 A | 11/2012 |
| JP | 2014060334 A | 4/2014 |
| JP | 2017017195 A | 1/2017 |
| JP | 2017037892 A | 2/2017 |

OTHER PUBLICATIONS

Office Action issued for counterpart Japanese Application No. 2018-566012, issued by the Japan Patent Office on Sep. 23, 2020 (dated Sep. 17, 2020).

* cited by examiner

SEMICONDUCTOR MODULE, ELECTRIC VEHICLE, AND POWER CONTROL UNIT

The contents of the following Japanese patent application(s) are incorporated herein by reference:
NO. 2017-019964 filed in JP on Feb. 6, 2017, and
NO. PCT/JP2018/000370 filed on Jan. 10, 2018.

BACKGROUND

1. Technical Field

The present invention relates to a semiconductor module, an electric vehicle and a power control unit.

2. Related Art

Conventionally, a semiconductor module comprising semiconductor chips of an insulated gate bipolar transistor (IGBT), a diode, a metal oxide field effect transistor (MOSFET) or the like has been known (see Patent documents 1 and 2, for example).

Patent Document 1: Japanese Patent Application Publication No. 2007-266608
Patent Document 2: Japanese Patent Application Publication No. 2012-212713

In the semiconductor module comprising semiconductor chips, heat dissipation is preferably performed efficiently.

In a first aspect of the present invention, a semiconductor module comprising a plurality of semiconductor chips is provided. The semiconductor module may comprise a lead frame that is connected to the plurality of semiconductor chips. The semiconductor module may comprise a main terminal connected to the lead frame. The lead frame may have an electrical connection portion that electrically connects a plurality of semiconductor chips to the main terminal. The lead frame may have a heat dissipation portion provided to extend from the electrical connection portion.

The heat dissipation portion does not extend a path of a current that flows between the main terminal and the plurality of semiconductor chips. The electrical connection portion may have a first plate-shaped portion that: is connected to the main terminal; and has a longitudinal direction in a direction from the main terminal to the plurality of semiconductor chips. The heat dissipation portion may be provided to extend from the first plate-shaped portion in a direction different from the longitudinal direction of the first plate-shaped portion.

The heat dissipation portion may have a vertically extending portion that extends in an upward direction or a downward direction with respect to a main surface of the first plate-shaped portion. The heat dissipation portion may have one or more second plate-shaped portions provided at a height that is different from that of the first plate-shaped portion. At least one of the second plate-shaped portions may have a main surface facing the main surface of the first plate-shaped portion. The vertically extending portion may connect the first plate-shaped portion to the second plate-shaped portion.

The heat dissipation portion may have one or more second plate-shaped portions provided at a height that is different from that of the first plate-shaped portion. At least one of the second plate-shaped portions may have a main surface that is inclined to the main surface of the first plate-shaped portion. The vertically extending portion may connect the first plate-shaped portion to the second plate-shaped portion.

The electrical connection portion may further have a plurality of chip connection portions that connect each of the semiconductor chips to the first plate-shaped portion. Each of the electrical connection portion and the heat dissipation portion may have one or more plate-shaped portions that are arranged at different heights. An interval between the uppermost plate-shaped portion and a second uppermost plate-shaped portion below the uppermost plate-shaped portion may be larger than an interval between any other pair of adjacent plate-shaped portions.

Each of the electrical connection portion and the heat dissipation portion may have one or more plate-shaped portions arranged at different heights. The uppermost plate-shaped portion may be thinner than any other plate-shaped portions.

Each of the electrical connection portion and the heat dissipation portion may have one or more plate-shaped portions that are arranged at different heights. A through hole may be formed in any of the plate-shaped portions. The through hole may be formed at the vertically extending portion. The lead frame may include at least two bonded metal members.

In a second aspect of the present invention, an electric vehicle comprising the semiconductor module in accordance with the first aspect is provided.

In a third aspect of the present invention, a power control unit comprising the semiconductor module in accordance with the first aspect is provided.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
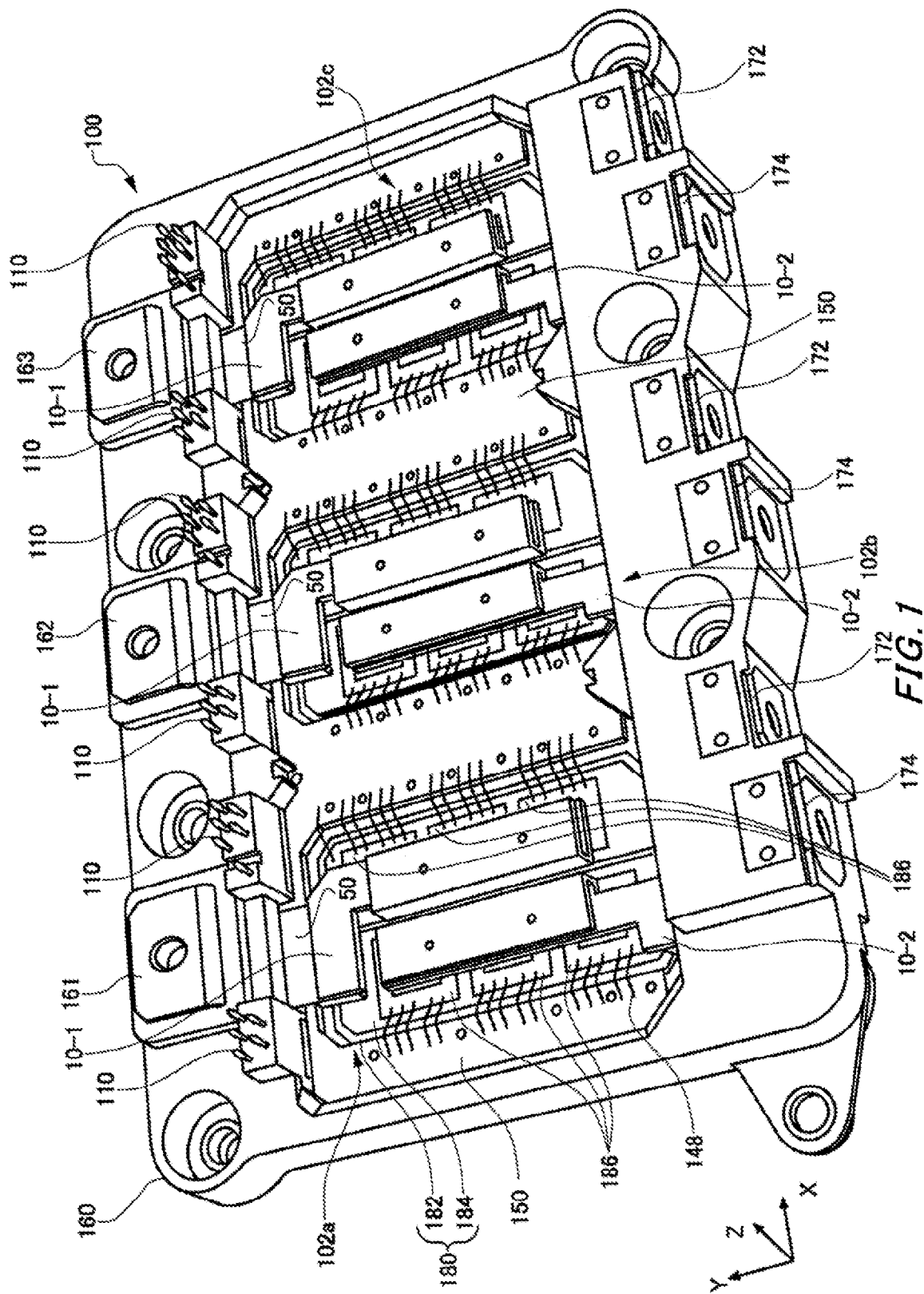
FIG. 1 is a perspective view generally showing a semiconductor module 100 in accordance with a first embodiment in the present invention.

FIG. 1 is a perspective view generally showing a semiconductor module 100 of a first embodiment in the present invention. The semiconductor module 100 houses therein an electronic circuit that includes, for example, a plurality of semiconductor chips 186 in which power semiconductor elements such as IGBTs are formed. The semiconductor module 100 of the present example comprises a resin casing 160 that houses a plurality of semiconductor chips 186.

In FIG. 1, a plane parallel to a front surface of a resin casing 160 is defined as an XY plane. In addition, a longitudinal direction on the front surface of the resin casing 160 is defined as an X-direction, while a transverse direction thereon is defined as a Y-direction. However, the transverse direction may be the X-direction, while the longitudinal directions may be the Y-direction. Also, a direction perpendicular to the XY plane is defined as a Z-direction. In the present specification, the Z-direction is referred to as a height direction in some cases. Also, the direction from the bottom of the resin casing 160 to the front surface may be referred to as "upward," and the direction from the front surface to the bottom may be referred to as "downward." Note that the upward and downward directions do not necessarily coincide with gravitational directions. Also, in coordinate axes of X, Y and Z shown in the drawings, a side with an arrow is defined as a "+ side," while an opposite side thereof is defined as a "− side."

As one example, the semiconductor module 100 acts as a power conversion circuit; however, a circuit formed in the semiconductor module 100 is not limited to a power conversion circuit. The semiconductor module 100 in the example of FIG. 1 is a three-phase power conversion circuit. The semiconductor module 100 of the present example has housing sections 102a, 102b and 102c that house semiconductor chips 186 for each phase of the power conversion circuit. A housing section 102 may be a recess that is formed in the resin casing 160.

A lead frame 10 is arranged over semiconductor chips 186 that are arranged in each housing section 102. As one example, the lead frame 10 is a plate-shaped conductor formed of a metal such as copper. In FIG. 1, each lead frame 10 is shown schematically. A shape and so on of the lead frame 10 will be described later.

Two lead frames 10 corresponding to an upper arm and a lower arm for each phase of the power conversion circuit are arranged in each housing section 102. Each lead frame 10 is connected to the main electrodes of the plurality of semiconductor chips 186 that are included in the corresponding arm. The semiconductor chips 186 may be vertical power semiconductor elements comprising the main electrodes formed on upper surfaces thereof and the main electrodes formed on lower surfaces opposite to the upper surfaces. The main electrodes are electrodes in which a large current flows, such as a collector current of an IGBT, for example. The main electrodes in the IGBT chips are collector electrodes and emitter electrodes. However, the semiconductor chips 186 are not limited to the IGBTs, but may be MOSFETs. In addition, diodes may be connected in parallel to the transistors of the IGBTs, MOSFETs or the like. Furthermore, the power semiconductor elements may be RC-IGBTs (reverse conducting IGBTs) having IGBT regions and FWD regions. A substrate for a semiconductor chip may include silicon or silicon carbide.

A plurality of main terminals are fixed to the resin casing 160. The main terminal is a terminal in which a large current such as the collector current of the IGBT flows. The semiconductor module 100 of the present example comprises as the main terminal a U terminal 161, a V terminal 162, a W terminal 163, a P terminal 172 and an N terminal 174.

The U terminal 161, V terminal 162 and W terminal 163 are output terminals in respective phases of the power conversion circuit. The P terminal 172 is a terminal to be connected to a high-voltage side line of the power conversion circuit, and the N terminal 174 is a terminal to be connected to a low-voltage side line thereof.

Each lead frame 10 electrically connects the corresponding plurality of semiconductor chips 186 to the corresponding main terminals. For example, the lead frame 10-1 of the housing section 102a electrically connects the main electrode, such as the emitter electrode formed on the upper surface of each semiconductor chip 186, to the U terminal 161. The plurality of semiconductor chips 186 are connected in parallel to the one lead frame 10.

The semiconductor module 100 may comprise the connection portion 50 that electrically connects each lead frame 10 to the main terminal. The connection portion 50 may support the lower surface at the end portion of the lead frame 10. The connection portion 50 may include a block formed of a conductive material such as copper.

The semiconductor module 100 of the present example further comprises a plurality of pins 110 and a plurality of printed board 150. The pins 110 may be connected to control terminals such as gate terminals of the semiconductor chips 186 through the printed board 150. A current that is smaller than that of the lead frame 10 flows in the pins 110. The printed board 150 may be connected to the semiconductor chips 186 through a line such as a wire 148. The semiconductor chips 186, the lead frame 10 and the printed board 150 may be sealed in with a resin. The resin may be a sealing material such as a gel of a silicone gel or the like, a silicone resin or an epoxy resin. The sealing material may include a filler.

The semiconductor module 100 may comprise a stacked substrate 180 housed in each of the housing sections 102a, 102b and 102c. The stacked substrate 180 may comprises an insulating substrate 182 and a metal foil 184. The metal foil 184 is formed on the upper surface of the insulating substrate 182. The metal foil 184 may be a copper foil. The metal foil 184 is connected to the main electrode such as the collector electrode that is formed on the lower surface of each semiconductor chip 186. The metal foil 184 is electrically separated by each arm. In addition, the semiconductor module 100 may comprise at the bottom thereof a cooler that is thermally and mechanically connected to the lower surface of the insulating substrate 182. A refrigerant may be supplied to the cooler from the external.

Figure 2:
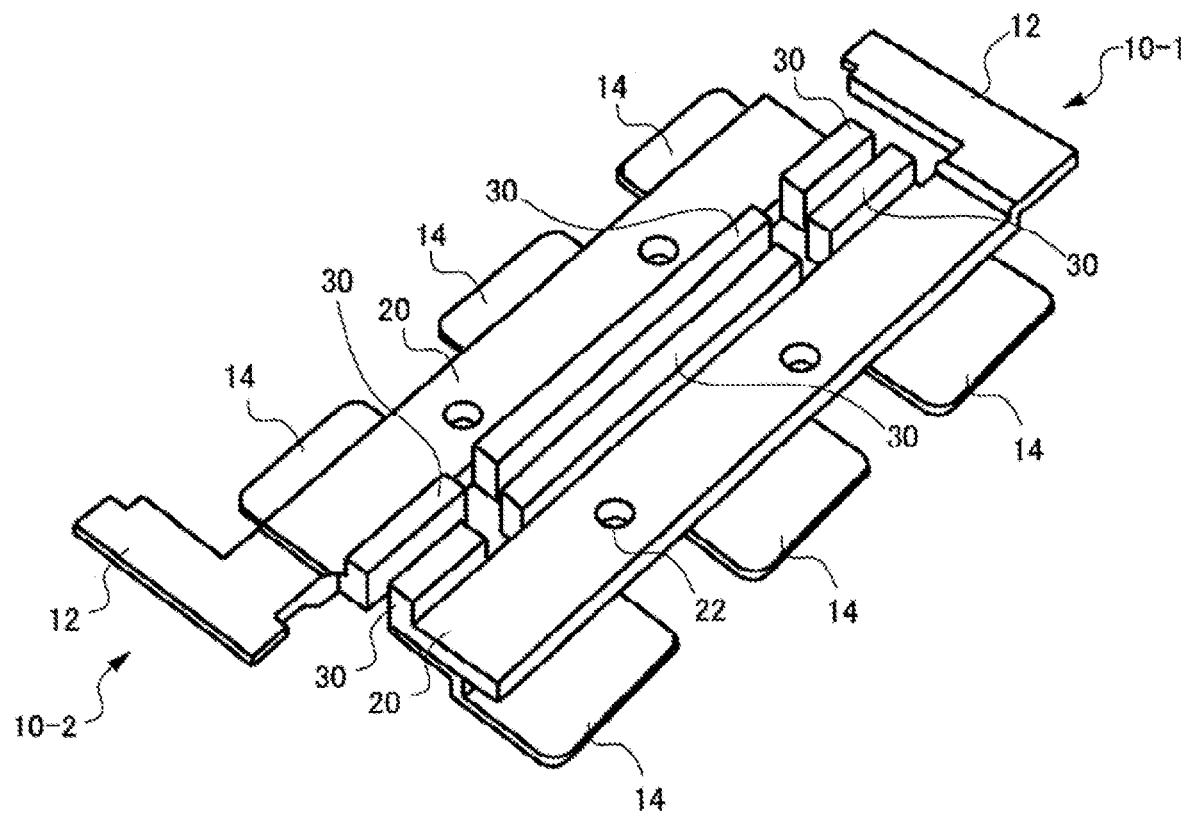
FIG. 2 is a perspective view showing one example of a pair of a lead frame 10-1 and a lead frame 10-2 in each phase.

FIG. 2 is a perspective view showing one example of a pair of the lead frame 10-1 and a lead frame 10-2 in each phase. The lead frame 10-1 and the lead frame 10-2 may have substantially the same structure. In the present example, a structure in which one of the lead frame 10-1 and the lead frame 10-2 is provided as the lead frame 10 is described. However, each lead frame 10 may have the same structure.

The lead frame 10 may have electrical connection portions that electrically connect the plurality of semiconductor chips 186 to the main terminals. The lead frame 10 of the present example comprises a terminal connection portion 12 that acts as the electrical connection portion, a first plate-shaped portion 20 and a plurality of chip connection portions 14. The terminal connection portion 12 is connected to the connection portion 50 shown in FIG. 1. The chip connection portions 14 are connected to the semiconductor chips 186 shown in FIG. 1. A chip connection portion 14 is provided for each semiconductor chip 186. In the present specification, the first plate-shaped portion 20 may be simply referred to as the plate-shaped portion 20. The plate-shaped portion 20 is a tabular portion that is provided between the terminal connection portion 12 and the chip connection portion 14.

The lead frame 10 of the present example comprises the one plate-shaped portion 20. In this case, the terminal connection portion 12 and the plurality of chip connection portions 14 are electrically and mechanically connected to the one plate-shaped portion 20. The terminal connection portion 12 and the plurality of chip connection portions 14 may be formed integrally with the plate-shaped portion 20, or may be bonded by soldering, brazing or the like. In the example of FIG. 2, the terminal connection portion 12 is formed integrally with the plate-shaped portion 20, and the plurality of chip connection portion 14 each are bonded to the lower surface of the plate-shaped portion 20.

The chip connection portion 14 may be formed to be thinner than that of the plate-shaped portion 20. Thereby, springiness of the chip connection portion 14 can be increased, which can alleviate a stress to be produced in the lead frame 10 and so on. The thickness of the chip connection portion 14 may be less than or equal to one half of the thickness of the plate-shaped portion 20.

In the present example, a plane in parallel to the upper surface and lower surface of the plate-shaped portion 20 is defined as an XY plane. Also, a direction perpendicular to the XY plane is defined as Z-axis direction. Also, a direction of a straight line that connects the terminal connection portion 12 to the chip connection portion 14 farthest from the terminal connection portion 12 is defined as Y-axis direction. Also, a longitudinal direction that is a direction along the longest side in the plate-shaped portion 20 may be defined as the Y-axis direction. The main surface of the plate-shaped portion 20 refers to a surface having the largest area of the surfaces of the plate-shaped portion 20, and a back surface thereof. In the example of FIG. 2, the surface in parallel to the XY plane is the main surface of the plate-shaped portion 20.

In another example, the lead frame 10 may comprise a plurality of plate-shaped portions 20 that act as electrical connection portions. For example, the terminal connection portion 12 is connected to one plate-shaped portion 20, and a plurality of chip connection portions 14 are connected to another plate-shaped portion 20. The two plate-shaped portions 20 are connected by a conductive member. In such a case, the two plate-shaped portions 20 act as the electrical connection portion that connects the main terminal to a semiconductor chip 186. Also, the one or more plate-shaped portions 20 may be further provided between the plate-shaped portion 20 to be connected to the terminal connection portion 12, and the plate-shaped portion 20 to be connected to the chip connection portion 14. The adjacent plate-shaped portions 20 are connected by the conductive member. In this case, three or more plate-shaped portions 20 act as the electrical connection portion.

The lead frame 10 may have a heat dissipation portion provided to extend from the electrical connection portion. The heat dissipation portion may be formed integrally with the electrical connection portion using the same material as that of the electrical connection portion. The lead frame 10 of the present example comprises a vertically extending portion 30 that is provided to extend in an upward direction or a downward direction (that is, Z-axis direction) from the plate-shaped portion 20 that acts as the electrical connection portion. The vertically extending portion 30 acts as the heat dissipation portion.

The vertically extending portion 30 is formed such that an angle thereof to the upper surface of the plate-shaped portion 20 is extended in a direction that becomes larger than zero degrees and ninety degrees or smaller. The vertically extending portion 30 in the example of FIG. 2 is formed to protrude in a protruding direction (Z-axis direction) perpendicular to the upper surface of the plate-shaped portion 20. The end portion in the protruding direction of the vertically extending portion 30 is not connected to another conductive member that constructs the electrical connection portion.

The heat dissipation portion does not have to extend a current path that flows between the main terminal and a semiconductor chip 186. "Not to extend the current path" may refer to, for example, that the heat dissipation portion is provided at a portion that is not the shortest path, and that electrically connects the plurality of semiconductor chips 186 of the electrical connection portions to the main terminals. Also, this may refer to the following: for example, in the case where in the lead frame 10 provided with the heat dissipation portion, and the lead frame 10 not provided with the heat dissipation portion, electrical resistances thereof from the chip connection portion 14 to the terminal connection portion 12 are compared, the lead frame 10 provided with the heat dissipation portion has a smaller electrical resistance in either of the chip connection portions 14. In the example of FIG. 2, as compared to the case where the vertically extending portion 30 protruding upwardly from the upper surface of the plate-shaped portion 20 is removed, the case provided with the vertically extending portion 30 has a smaller electrical resistance by 3% or more. Note that the surface area of the heat dissipation portion may occupy 10% or more of the surface area of the lead frame 10, may occupy 20% or more thereof, and may occupy 50% or more thereof.

The vertically extending portion 30 may be provided along the side in parallel to the longitudinal direction of the plate-shaped portion 20. As shown in FIG. 2, the vertically extending portion 30 may be provided in the side adjacent to another lead frame 10, of the sides in the longitudinal direction of the plate-shaped portion 20. One pair of the lead frames 10-1, 10-2 have substantially the same shape, and may be arranged in a position that is rotationally symmetrical about Z-axis such that the respective vertically extending portions 30 face each other. In this case, the two vertically extending portions 30 in the two lead frames 10 may be arranged in parallel to each other.

The plurality of vertically extending portion 30 may be discretely arranged along the side in the longitudinal direction of the plate-shaped portion 20. That is, a gap is provided between the adjacent, vertically extending portions 30. When that gap is provided, a resin injection is facilitated, and also a work such as soldering is facilitated in packaging of the lead frame 10.

Also, in the plate-shaped portion 20, a through hole 22 may be formed. When the through hole 22 is formed, the resin injection into the lower side of the plate-shaped portion 20 is facilitated. A plurality of the through holes 22 may be formed in the one plate-shaped portion 20. The through hole 22 may be provided at a position not overlapping with the chip connection portion 14.

The surface area of the heat dissipation portion may be smaller or otherwise larger than that of the plate-shaped portion 20. At least part of the heat dissipation portion may be formed by the same thickness as that of the plate-shaped portion 20. When the heat dissipation portion is formed by the same thickness as that of the plate-shaped portion 20, the lead frame 10 can be readily formed from a metal plate with a uniform thickness. Also, at least part of the heat dissipation portion may be formed thinner than the plate-shaped portion 20. The whole heat dissipation portion may be formed thinner than the plate-shaped portion 20. Even if the heat dissipation portion is formed thinner, an electrical resistance between the chip connection portion 14 and the terminal connection portion 12 is not increased.

With the above construction, both electrical characteristics and improvements in terms of heat dissipation efficiency can be achieved. For example, even elongation of a length of a current path that connects the main terminal to the semiconductor chip can increase the surface area of the conductive member to improve the heat dissipation efficiency, but the electrical resistance would be increased. The lead frame 10 of the present example can improve the heat dissipation efficiency without the elongation of the length of the current path.

In addition, even by an increase in thickness of the plate-shaped portion 20, the surface area of the conductive member is increased, which can improve the heat dissipation efficiency. In this case, the electrical resistance can also be reduced. However, when the thickness of the plate-shaped portion 20 is increased, it becomes difficult to adjust the thickness of the terminal connection portion 12 or the chip connection portion 14 to be formed integrally with the plate-shaped portion 20. When the thickness of the conductive member is adjusted, an area to be adjusted is pressed by a press machine or the like; however, the thickness can be only adjusted to about half of an original thickness of the conductive member. Thus, when the thinner terminal connection portion 12 or the chip connection portion 14 can be formed integrally with the plate-shaped portion 20, it is difficult to make thicker the plate-shaped portion 20.

For example, in some cases, a raised portion extending in the Z-axis direction of the chip connection portion 14 is formed thinner in order to produce springiness. In this case, the thickness of the plate-shaped portion 20 can only be about twice the thickness of that portion. Thus, there are some cases where the heat dissipation efficiency is insufficient. The lead frame 10 of the present example can improve the heat dissipation efficiency without increasing the thickness of the plate-shaped portion 20.

Figure 3:
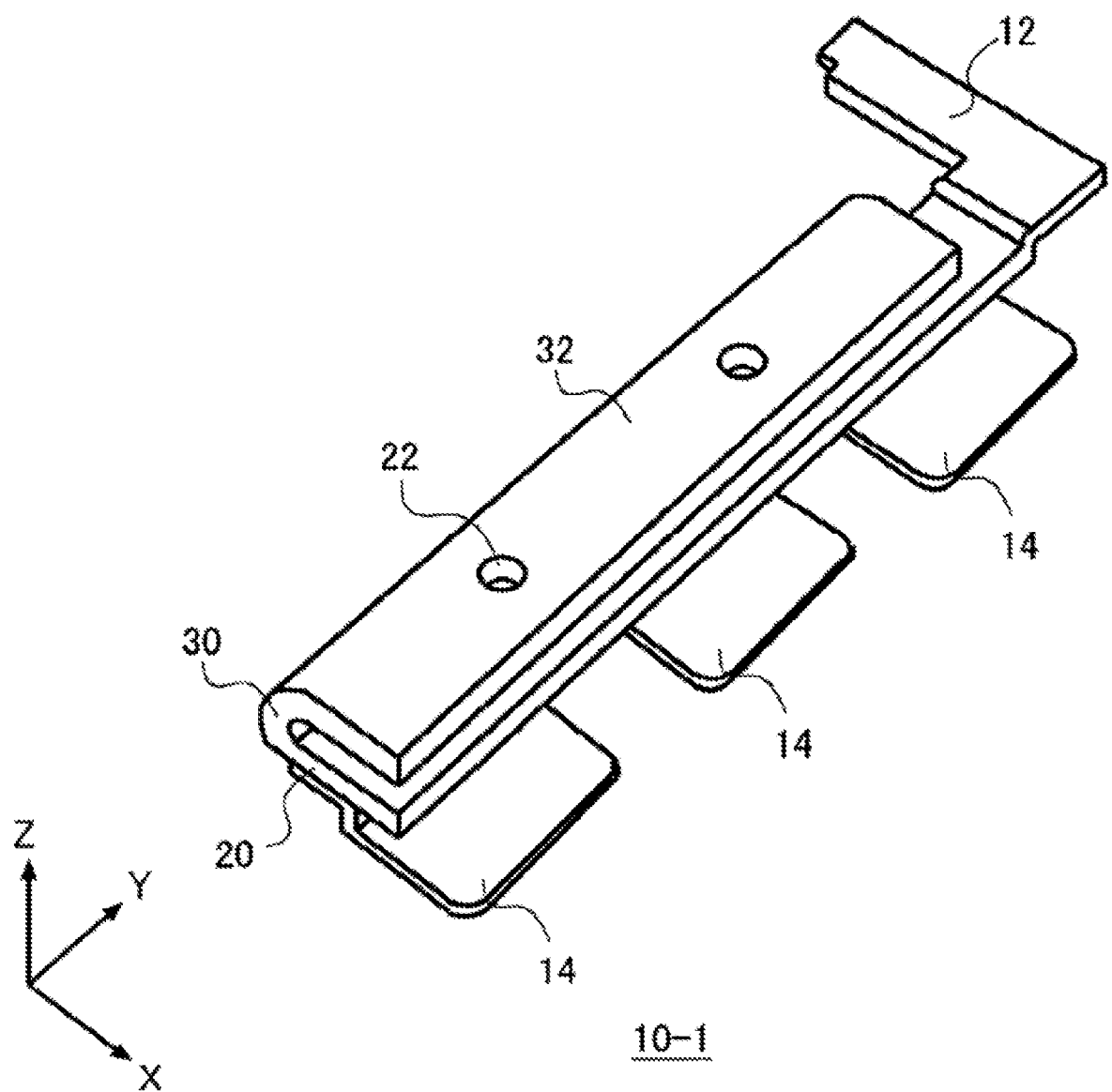
FIG. 3 is a perspective view showing another example of a lead frame 10.

FIG. 3 is a perspective view showing another example of a lead frame 10. In FIG. 3, the lead frame 10-1 is shown, while the lead frame 10-2 may also have a similar structure. In addition to the structure shown in FIG. 2, the lead frame 10 of the present example has a second plate-shaped portion 32. The second plate-shaped portion 32 acts as part of the heat dissipation portion In the present specification, the second plate-shaped portion 32 may be simply referred to as the plate-shaped portion 32.

The plate-shaped portion 32 has a main surface facing the main surface of the plate-shaped portion 20. The main surface of the plate-shaped portion refers to a surface having the largest area of the surfaces of the plate-shaped portion, and a back surface thereof. In the example of FIG. 3, the surface in parallel to the XY plane is the main surface of the plate-shaped portion. When viewed from the Z-axis direction, at least a partial area of the plate-shaped portion 32 overlaps with at least a partial area of the plate-shaped portion 20. In the example of FIG. 3, the whole plate-shaped portion 32 overlaps with the plate-shaped portion 20.

The plate-shaped portion 32 in the Z-axis direction is provided at a height different from that of the plate-shaped portion 20. The plate-shaped portion 32 of the present example is provided on the opposite side to the chip connection portion 14 across the plate-shaped portion 20. The plate-shaped portion 32 is formed to extend from the vertically extending portion 30 in a direction that covers the plate-shaped portion 20. The vertically extending portion 30 connects the plate-shaped portion 20 to the plate-shaped portion 32. The vertically extending portion 30 may have a curved shape in the XZ plane, and may have a straight shape.

The plate-shaped portion 32 is not directly connected to the conductive member that constitutes the electrical connection portion, for example, the terminal connection portion 12 and/or chip connection portion 14. Note that a heat dissipation member that constitutes the heat dissipation portion may be further connected to the end portion that is not connected to the vertically extending portion 30 of the end portions of the plate-shaped portion 32.

With the above structure, the heat dissipation efficiency of the lead frame 10 can be improved without an increase of the thickness of the plate-shaped portion 20. Note that that it is preferable that the through hole 22 is formed in the plate-shaped portion 32. In the present example, a space is produced between the plate-shaped portion 32 and the plate-shaped portion 20. When the through hole 22 is provided, a resin can be readily injected in that space. By a dense sandwich structure of the plate-shaped portion 32, the resin and the plate-shaped portion 20 without a void between the plate-shaped portion 32 and the plate-shaped portion 20, a heat dissipation efficiency to the upper surface of the semiconductor module 100 can be improved.

Figure 4:
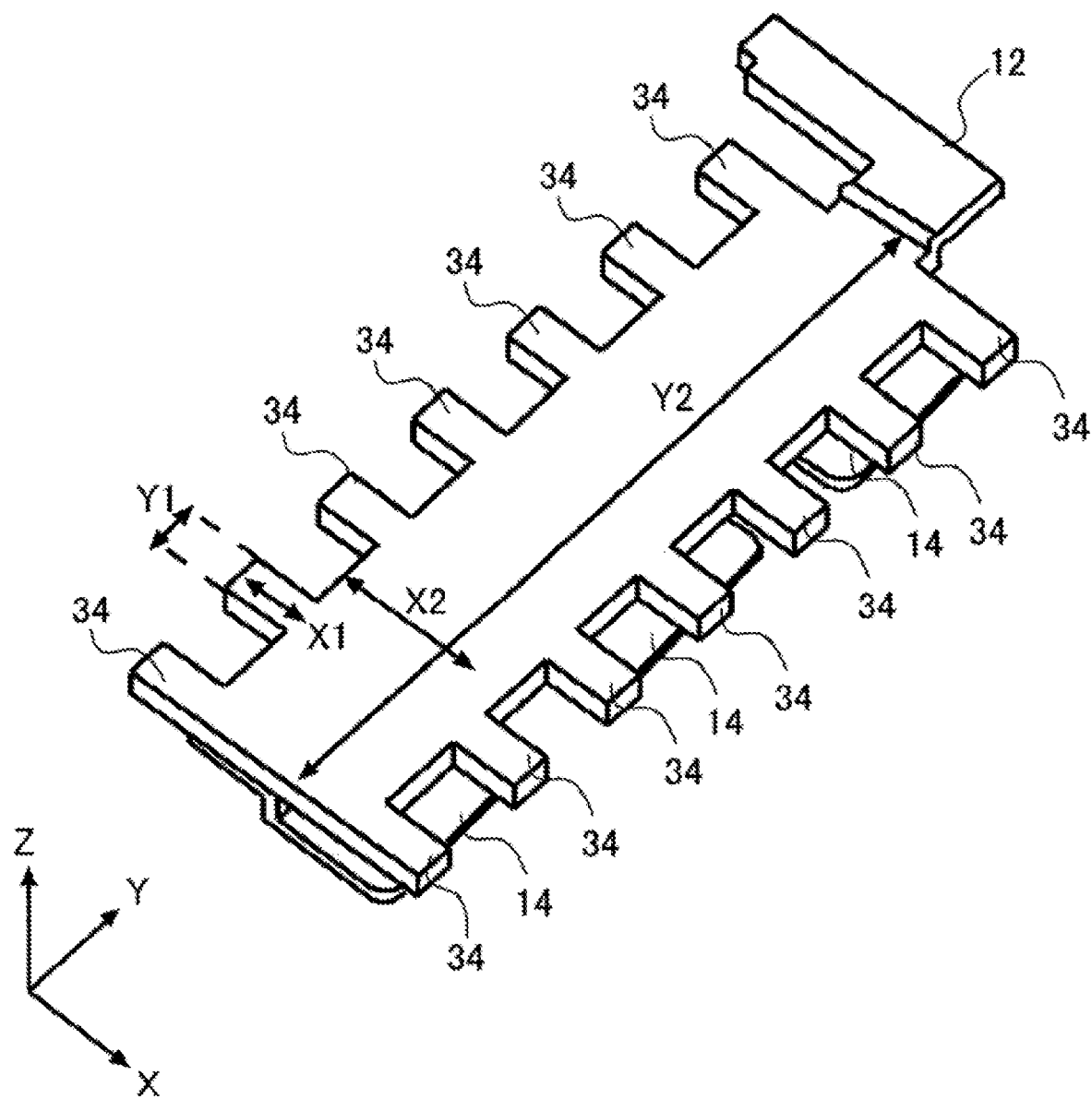
FIG. 4 is a perspective view showing another example of a lead frame 10.

FIG. 4 is a perspective view showing another example of a lead frame 10. In FIG. 4, the lead frame 10-1 is shown, while the lead frame 10-2 may also have a similar structure. In addition to the structure shown in FIG. 2, the lead frame 10 of the present example has one or more protruding portions 34. The protruding portion 34 acts as the heat dissipation portion. The protruding portion 34 is provided to protrude from any side of the plate-shaped portion 20 in a direction different from the longitudinal direction of the plate-shaped portion 20.

The protruding portion 34 of the present example protrudes from the side in the longitudinal direction of the plate-shaped portion 20 toward a direction (X-axis direction) perpendicular to the longitudinal direction, in the plane in parallel to the upper surface of the plate-shaped portion 20. In the example of FIG. 4, the protruding portion 34 is provided to protrude from the longer side on the +X-axis direction side to the +X-axis direction side, of the two longer sides in the longitudinal direction of the plate-shaped portion 20, and is also provided to protrude from the longer side on the −X-axis direction side to the −X-axis direction side. In another example, the protruding portion 34 may be provided only on any one of the two longer sides of the plate-shaped portion 20. The length Y1 of the protruding portion 34 in the longitudinal direction of the plate-shaped portion 20 is shorter than the length Y2 of the plate-shaped portion 20. The length Y1 may be less than or equal to one half of the length Y2, may be less than or equal to one fourth thereof, and may be less than or equal to one tenth thereof.

The protruding portion 34 in the example of FIG. 4 has a rectangular shape in the XY plane, but the shape of the protruding portion 34 is not limited to this. The protruding portion 34 may have a triangular shape, and may have another polygonal shape. The protruding portion 34 may have a semicircular shape. The end portion in the protruding direction of the protruding portion 34 is not connected to a conductive member that constructs the electrical connection portion, for example, the terminal connection portion 12 and the chip connection portion 14. Also when the protruding portion 34 is provided, the heat dissipation efficiency can be improved.

The length X1 in the protruding direction of the protruding portion 34 may be shorter than the length X2 in that direction of the plate-shaped portion 20. The length X1 may be longer than the length X2. The length X1 in the protruding direction of the protruding portion 34 may be longer than the length Y1.

When the protruding portion 34 is provided, the heat dissipation efficiency can be improved without an increase of the thickness of the plate-shaped portion 20. In addition, also the whole thickness of the lead frame 10 is not increased.

Figure 5:
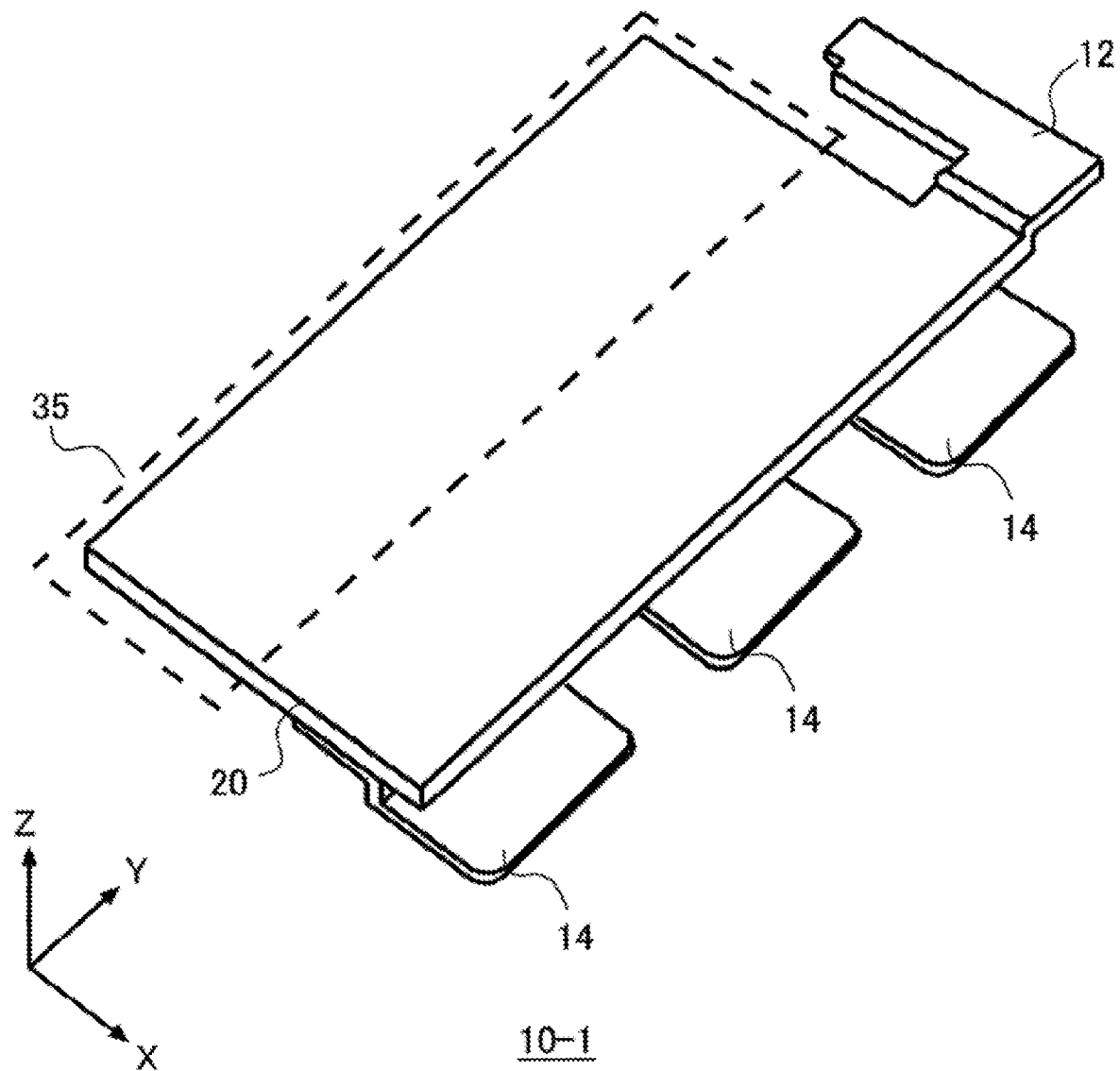
FIG. 5 is a perspective view showing another example of a lead frame 10.

FIG. 5 is a perspective view showing another example of a lead frame 10. In FIG. 5, the lead frame 10-1 is shown. In another example, the lead frame 10-2 may also have a structure as shown in FIG. 5.

The lead frame 10 of the present example has a laterally extending portion 35. The laterally extending portion 35 of the present example has a plate-shape, and is formed to extend from the plate-shaped portion 20. The laterally extending portion 35 is arranged to prevent an overlap with the plate-shaped portion 20 when viewed from the Z-axis direction. The laterally extending portion 35 of the present example is formed to extend from the side in the longitudinal direction of the plate-shaped portion 20 in the X-axis direction perpendicular to the longitudinal direction.

The area in the XY plane of the laterally extending portion 35 may be 10% or more of the lead frame 10, may be 20% or more thereof and may be 50% or more thereof. Also, as compared to the lead frame 10 without the laterally extending portion 35, the lead frame 10 with the laterally extending portion 35 has a smaller electrical resistance between the chip connection portion 14 and the terminal connection portion 12. The laterally extending portion 35 may be formed thinner than the plate-shaped portion 20 in the Z-axis direction. Also when the laterally extending portion 35 is provided, the heat dissipation efficiency can be improved.

The laterally extending portion 35 may be provided at a height that is different from that of the plate-shaped portion 20. In this case, the vertically extending portion 30 may be provided between the laterally extending portion 35 and the plate-shaped portion 20. The laterally extending portion 35 may be arranged to be overlapped with another lead frame 10-2 when viewed from the Z-axis direction. In this case, the lead frame 10-2 may have any of the aspects described in FIG. 2 to FIG. 4.

Figure 6:
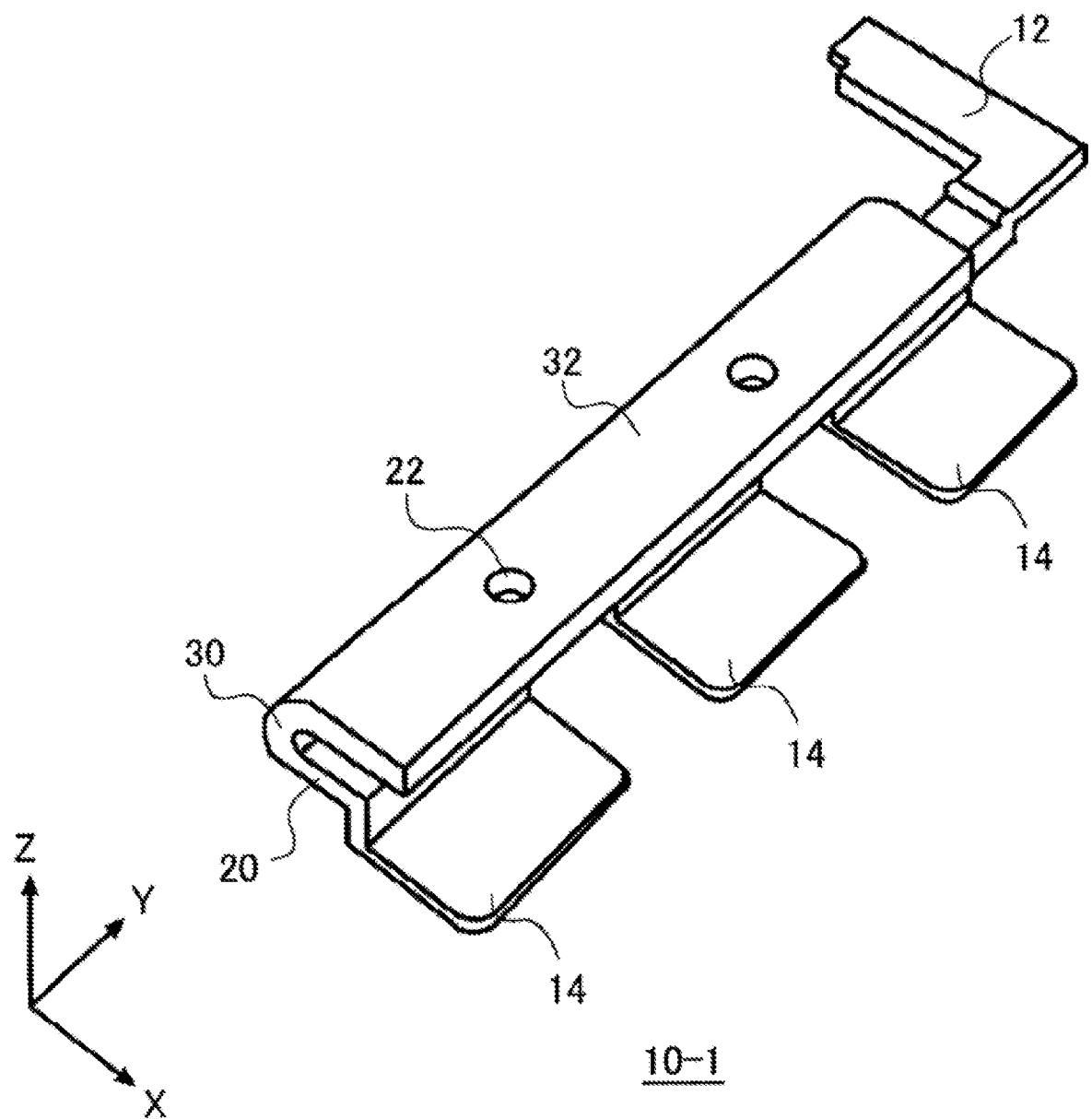
FIG. 6 is a perspective view showing another example of a lead frame 10.

FIG. 6 is a perspective view showing another example of a lead frame 10. In FIG. 6, the lead frame 10-1 is shown, while the lead frame 10-2 may also have a similar structure. In the lead frame 10 of the present example, the chip connection portion 14 is formed integrally with the plate-shaped portion 20. The other structure is the same as that of the lead frame 10 in any of the aspects described in FIG. 1 to FIG. 5.

Figure 7:
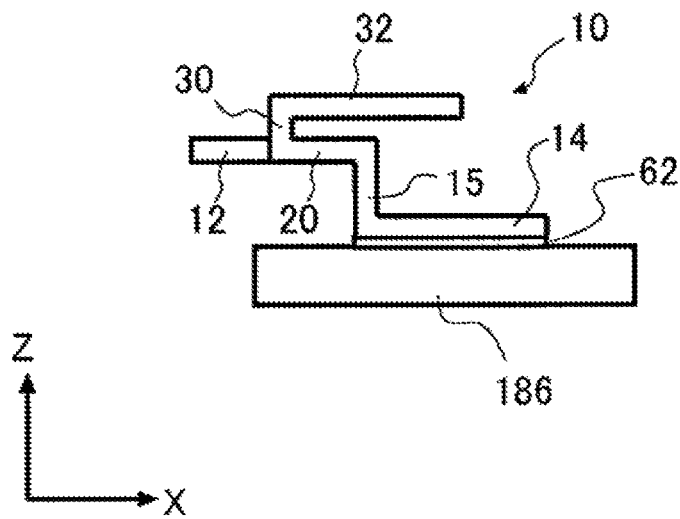
FIG. 7 is one example of a side view of a semiconductor chip 186 and the lead frame 10.

FIG. 7 is one example of a side view of the semiconductor chip 186 and the lead frame 10. The lead frame 10 of the present example corresponds to the lead frame 10 of FIG. 6. That is, the chip connection portion 14, the raised portion 15, the vertically extending portion 30, the plate-shaped portion 32 and the terminal connection portion 12 are formed integrally with the plate-shaped portion 20. Note that the lead frame 10 of FIG. 7 corresponds to the case where in the lead frame 10 of FIG. 6, the plate-shaped portion 20 and the terminal connection portion 12 have the same height.

The chip connection portion 14 is connected to the upper surface electrode of the semiconductor chip 186 through a fixation portion 62 by soldering or the like. The plate-shaped portion 20 is provided between the terminal connection portion 12 and the chip connection portion 14. The vertically extending portion 30 is provided to extend upward from the plate-shaped portion 20. The plate-shaped portion 32 is provided to extend from the vertically extending portion 30 in a direction that overlaps with the plate-shaped portion 20. The plate-shaped portion 32 may cover a wider range than the plate-shaped portion 20.

As shown in FIG. 7, since the vertically extending portion 30 and the plate-shaped portion 32 are not arranged on the shortest path that connects the terminal connection portion 12 to the chip connection portion 14, a current hardly flows therethrough. Note that the above portions act as the heat dissipation portion. Thus, the heat dissipation efficiency can be improved without elongation of the current path. A conductive member coupled with the plate-shaped portion 20 and formed above the upper surface of the plate-shaped portion 20 may be provided as the heat dissipation portion.

Figure 8:
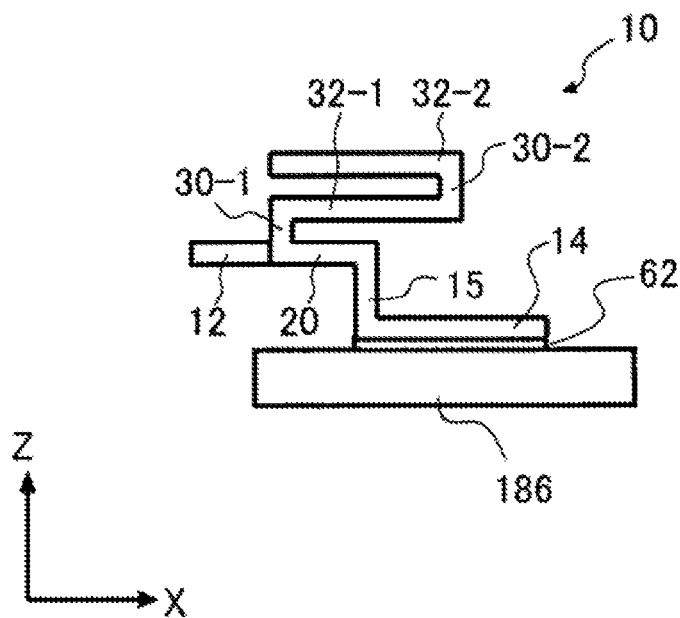
FIG. 8 is another example of a side view of a semiconductor chip 186 and a lead frame 10.

FIG. 8 is another example of the side view of the semiconductor chip 186 and the lead frame 10. The lead frame 10 of the present example has as the heat dissipation portion a vertically extending portion 30-1, a plate-shaped portion 32-1, a vertically extending portion 30-2 and a plate-shaped portion 32-2. The vertically extending portion 30-1 and the plate-shaped portion 32-1 are respectively the same as the vertically extending portion 30 and the plate-shaped portion 32 as shown in FIG. 7.

The vertically extending portion 30-2 is provided at the end side of the plate-shaped portion 32-1 that is opposite to the vertically extending portion 30-1. The vertically extending portion 30-2 is formed upward from that end side. The plate-shaped portion 32-2 is formed from the vertically extending portion 30-2 toward a direction that covers the plate-shaped portion 32-1. The size in the XY plane of the plate-shaped portion 32-2 may be the same as that of the plate-shaped portion 32-1.

In the lead frame 10 of the present example, the heat dissipation portion comprises the plurality of the plate-shaped portions 32. Thus, the heat dissipation efficiency can be further improved. Note that the interval between the two plate-shaped portions 32 may be smaller than the thickness of the plate-shaped portion 32. It is preferable that one or more through holes 22 are formed in each plate-shaped portion 32.

Figure 9:
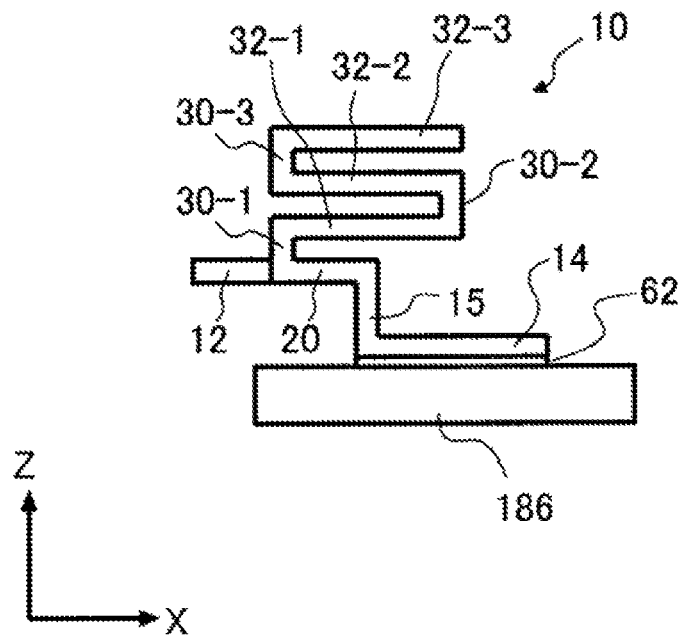
FIG. 9 is another example of a side view of a semiconductor chip 186 and a lead frame 10.

FIG. 9 is another example of the side view of the semiconductor chip 186 and the lead frame 10. In addition to the structure shown in FIG. 8, the heat dissipation portion in the lead frame 10 of the present example further comprises a vertically extending portion 30-3 and a plate-shaped portion 32-3.

The vertically extending portion 30-3 is provided at the end side of the plate-shaped portion 32-2 that is opposite to the vertically extending portion 30-2. The vertically extending portion 30-3 is formed upward from that end side. The plate-shaped portion 32-3 is formed from the vertically extending portion 30-3 toward a direction the covers the plate-shaped portion 32-2. The size in the XY plane of the plate-shaped portion 32-3 may be the same as that of the plate-shaped portion 32-2.

In the lead frame 10 of the present example, the heat dissipation portion comprises even more plate-shaped portions 32. Thus, the heat dissipation efficiency can be further improved.

Figure 10:
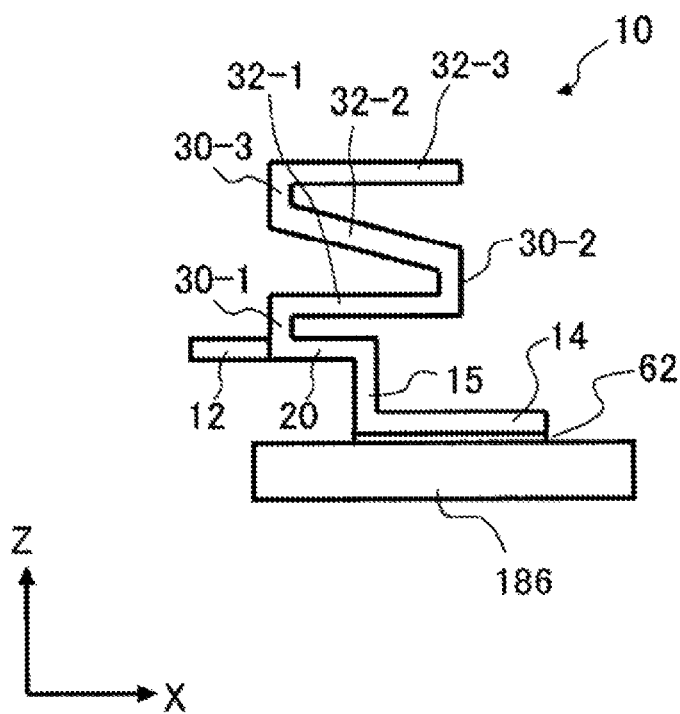
FIG. 10 is another example of a side view of a semiconductor chip 186 and a lead frame 10.

FIG. 10 is another example of the side view of the semiconductor chip 186 and the lead frame 10. The lead frame 10 of the present example has a similar structure to the example shown in any of FIG. 7 to FIG. 9. That is, the lead frame 10 has one or more plate-shaped portion 32 provided at a height different from that of the plate-shaped portion 20. Note that in the lead frame 10 of the present example, at least one plate-shaped portion 32 has a main surface that is inclined to the main surface of the plate-shaped portion 20. In the example of FIG. 10, the plate-shaped portion 32-2 has the inclined main surface. By the above structure, a resin can be readily injected between the two plate-shaped portions 32. Also, springiness in the heat dissipation portion can be improved.

Figure 11:
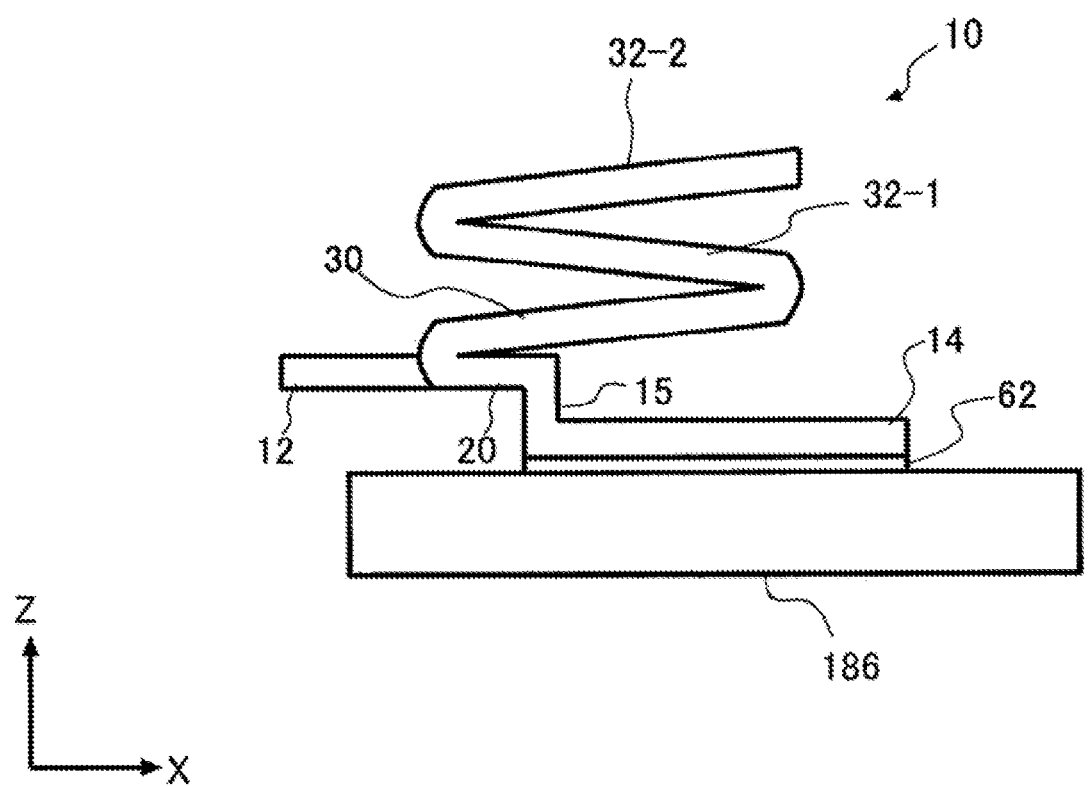
FIG. 11 is another example of a side view of a semiconductor chip 186 and a lead frame 10.

FIG. 11 is another example of the side view of the semiconductor chip 186 and the lead frame 10. The lead frame 10 of the present example has a similar structure to the example shown in any of FIG. 7 to FIG. 10. That is, the lead frame 10 has one or more plate-shaped portion 32 provided at a height different from that of the plate-shaped portion 20. Note that in the lead frame 10 of the present example, the vertically extending portion 30 is formed to extend in an inclined direction such that an angle thereof to the main surface of the plate-shaped portion 20 is not perpendicular. Also, at least one plate-shaped portion 32 has a main surface that is not in parallel to the main surface of the plate-shaped portion 20, but inclined to the main surface thereof. In the example of FIG. 11, both of the plate-shaped portions 32-1, 32-2 have the inclined main surface. By the above structure, a resin can be readily injected among the plate-shaped portion 20 and the two plate-shaped portions 32. Also, springiness in the heat dissipation portion can be improved.

Figure 12:
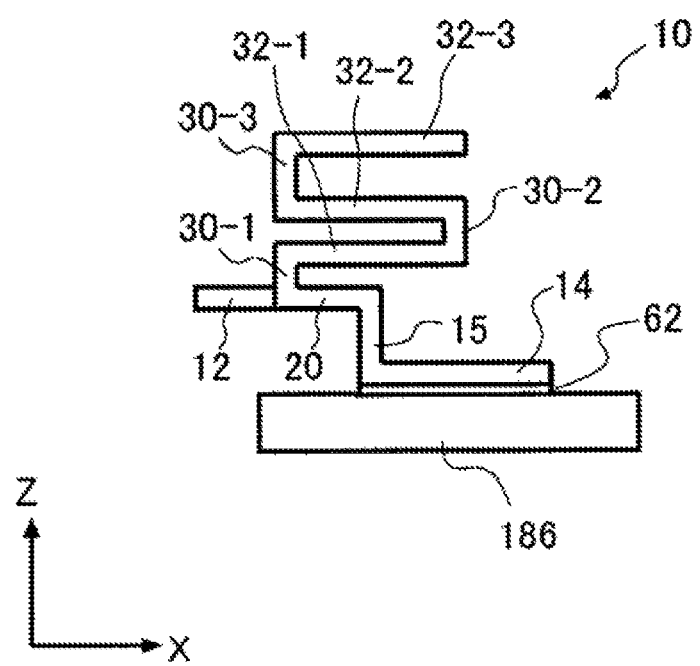
FIG. 12 is another example of a side view of a semiconductor chip 186 and a lead frame 10.

FIG. 12 is another example of the side view of the semiconductor chip 186 and the lead frame 10. The lead frame 10 of the present example has a similar structure to the example shown in any of FIG. 7 to FIG. 11. Note that in the lead frame 10 of the present example, an interval between the uppermost plate-shaped portion 32-3 and the second uppermost plate-shaped portion 32-2 below the uppermost plate-shaped portion 32-3 is larger than an interval between in any other pair of adjacent plate-shaped portions. The interval between the plate-shaped portions may be larger as they go up. By the above structure, a resin can be readily injected between the plate-shaped portions.

Figure 13:
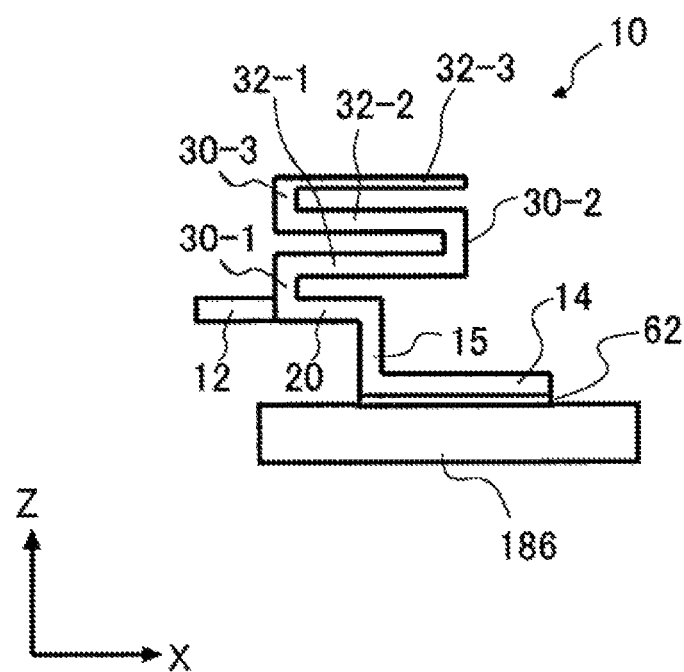
FIG. 13 is another example of a side view of a semiconductor chip 186 and a lead frame 10.

FIG. 13 is another example of the side view of the semiconductor chip 186 and the lead frame 10. The lead frame 10 of the present example has a similar structure to the example shown in any of FIG. 7 to FIG. 12. Note that in the lead frame 10 of the present example, the uppermost plate-shaped portion 32-3 is formed thinner than any of the other plate-shaped portions 32. The thickness of the plate-shaped portion 32 may be made thinner as it is farther from the plate-shaped portion 20. Thereby, a ratio of the surface area to the volume in the plate-shaped portion 32 can be increased, which can perform the heat dissipation efficiently in a smaller volume. Note that as the distance from the plate-shaped portion 20 increases, the influence on the electrical resistance decreases, so that even when the thickness of the plate-shaped portion 32 is made thinner, the electrical resistance of the lead frame 10 is hard to be lowered.

Figure 14:
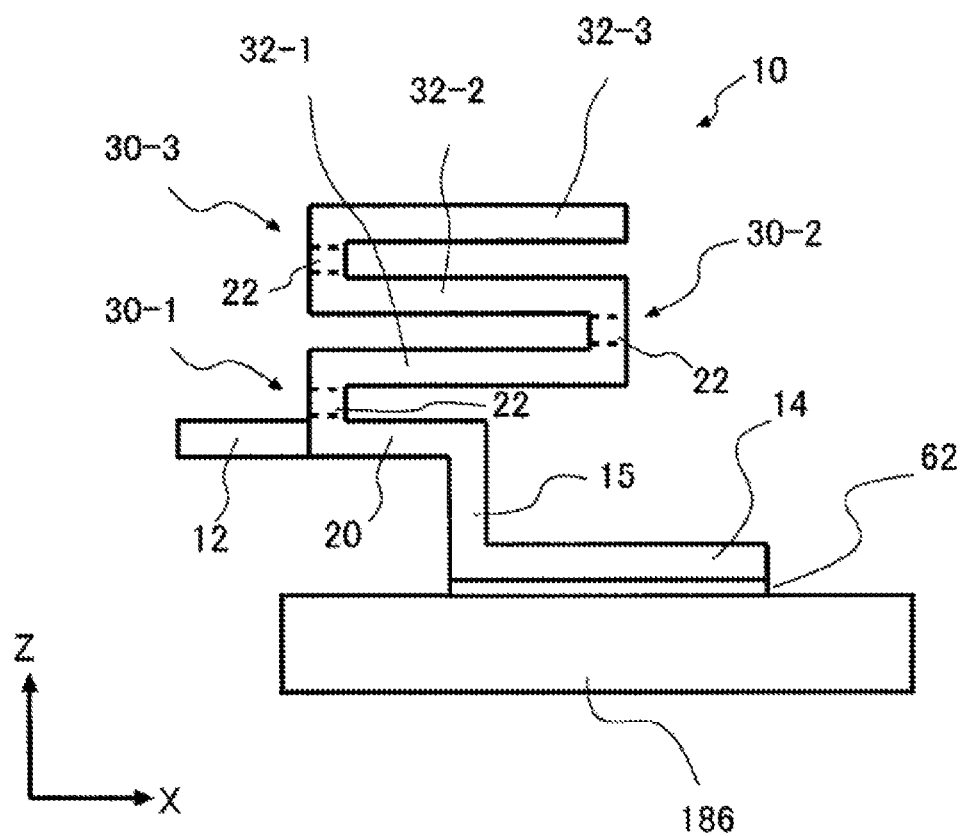
FIG. 14 is another example of a side view of a semiconductor chip 186 and a lead frame 10.

FIG. 14 is another example of the side view of the semiconductor chip 186 and the lead frame 10. The lead frame 10 of the present example has a similar structure to the example shown in any of FIG. 7 to FIG. 13. Note that in the lead frame 10 of the present example, a through hole 22 is formed in any of the vertically extending portions 30. In the example of FIG. 14, the one or more through holes 22 are formed in all of the vertically extending portions 30. Since the vicinity of the vertically extending portions 30 is surrounded by the two plate-shaped portions and the vertically extending portions 30, a resin is hard to be entered thereinto. When the through hole 22 is provided in the vertically extending portion 30, a resin can be injected even in the vicinity of the vertically extending portion 30.

Note that in the examples of FIG. 1 to FIG. 14, the lead frame 10 may include at least two bonded metal members. The metal members each are bonded by soldering, brazing or the like. As one example, a portion that acts as the heat dissipation portion may be bonded to the plate-shaped portion 20. Also, as shown in FIG. 2 and so on, the chip connection portion 14 may be bonded to the plate-shaped portion 20. When the plurality of metal members are bonded, a degree of freedom in the structure of the lead frame 10 can be improved.

In addition, the metal member such as the plate-shaped portion 32 that acts as the heat dissipation portion may have a recess. The recess does not penetrate through the metal member. Thereby, the surface area of the heat dissipation portion is larger, so that the heat dissipation efficiency can be further increased.

The semiconductor module of the present invention comprises the plurality of semiconductor chips 186, the lead frame 10 connected to the plurality of semiconductor chips 186 and the main terminals connected to the lead frame 10. The lead frame 10 has the electrical connection portion that electrically connects the plurality of semiconductor chips 186 to the main terminals, and the heat dissipation portion that is provided to extend from the electrical connection portion. The heat dissipation portion is provided at the portion that is not the shortest path in the path of a current that flows between the plurality of semiconductor chips 186 and the main terminals.

Specifically, the electrical connection portion has the plate-shaped portion 20, the terminal connection portion 12 and the chip connection portion 14. The plate-shaped portion 20 has a tabular, substantially rectangular main surface. The terminal connection portion 12 is provided in a shorter side of the main surface of the plate-shaped portion 20, and electrically connects to the main terminal. Furthermore, in the main surfaces of the substantially rectangular plate-shaped portion 20, the chip connection portion 14 is formed on one main surface side having the plurality of semiconductor chips 186, and the heat dissipation portion is formed on the other main surface side. Furthermore, in the longer sides of the substantially rectangular plate-shaped portion 20, the chip connection portion 14 is formed on one side, and the heat dissipation portion is formed on the other side.

Figure 15:
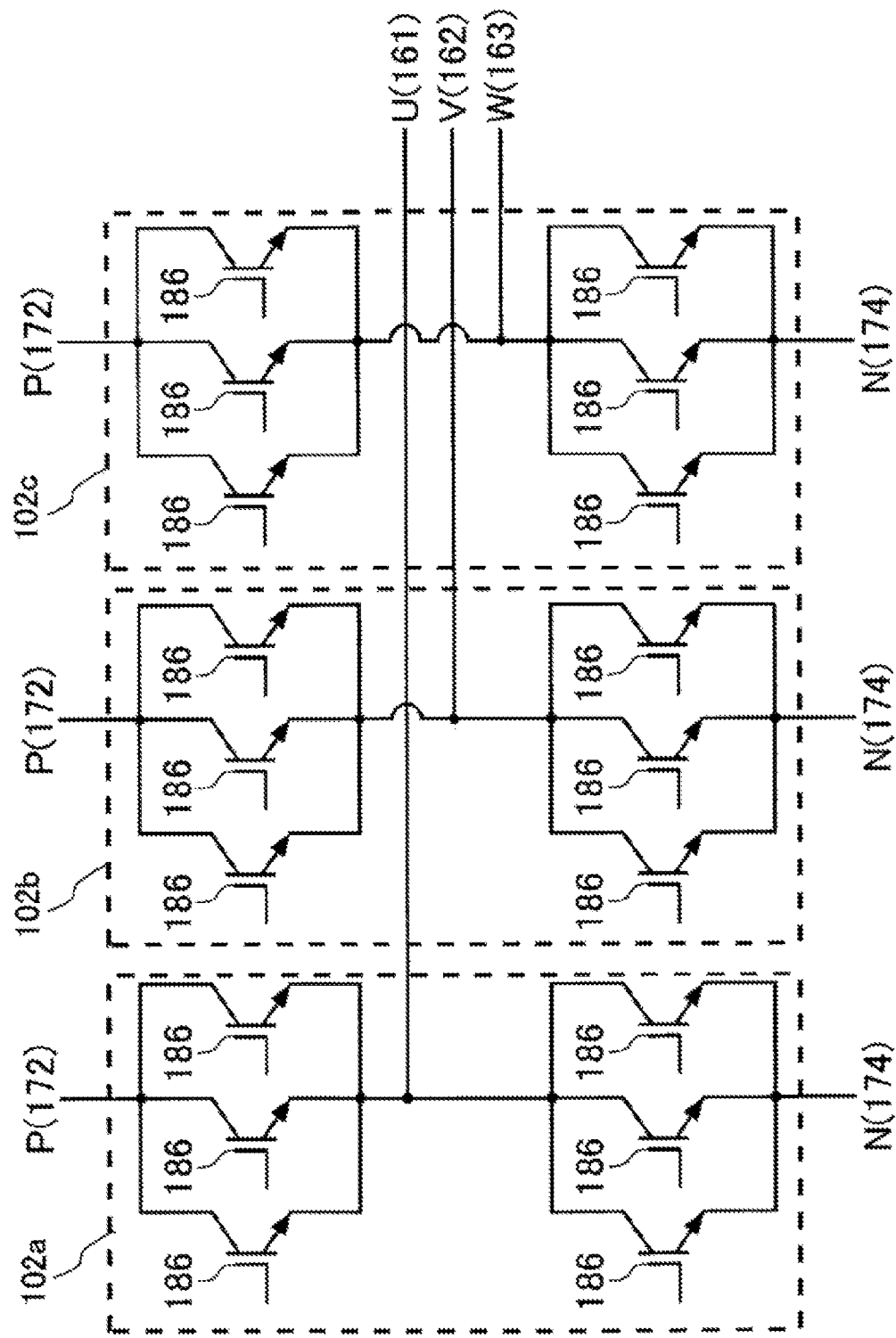
FIG. 15 is a diagram showing one example of a three-phase power conversion circuit.

FIG. 15 is a diagram showing one example of a three-phase power conversion circuit. As described above, the plurality of semiconductor chips 186 may be electrically connected in parallel in each of the upper and lower arms in each phase. The semiconductor chips 186 may be RC-IGBTs (reverse conducting IGBTs) having IGBT regions and FWD regions. The circuit in each phase may be formed in each housing section 102 in the resin casing 160. Note that the arrangement of the semiconductor chips 186 in the semiconductor module 100 is not limited to this. Note that although a freewheeling diode is not described in FIG. 15, in the case where RC-IGBTs are not used as the semiconductor chips 186, a circuit and a chip arrangement in which the freewheeling diode is connected to a semiconductor chip of a transistor such as an IGBT and/or a MOSFET may be provided. The freewheeling diode may be connected in reverse parallel to the transistor. A circuit in a plurality of phases may be provided in the one housing section 102, and one arm portion in any phase may be provided in the one housing section 102. Also, the semiconductor module 100 does not have to be the power conversion circuit. Note that in the above-mentioned example, the semiconductor module in which the circuit is housed in the housing section of the resin casing 160 is described. However, the semiconductor module of the present invention is not limited to these cases. In the semiconductor module, the lead frame 10 connected to the main terminal only has to comprise the various heat dissipation portions described above, and may not necessarily have the resin casing 160. As the heat dissipation portion, various types of structures can be adopted, such as the above-mentioned vertically extending portion 30 (FIG. 2), the second plate-shaped portion 32 (FIG. 3), the protruding portion 34 (FIG. 4), the vertically extending portion 30 and the plate-shaped portion 32 (FIG. 7), "the vertically extending portion 30-1, the plate-shaped portion 32-1, the vertically extending portion 30-2, and the plate-shaped portion 32-2" (FIG. 8), or "the vertically extending portion 30-3 and the plate-shaped portion 32-3" (FIG. 9).

Figure 16:
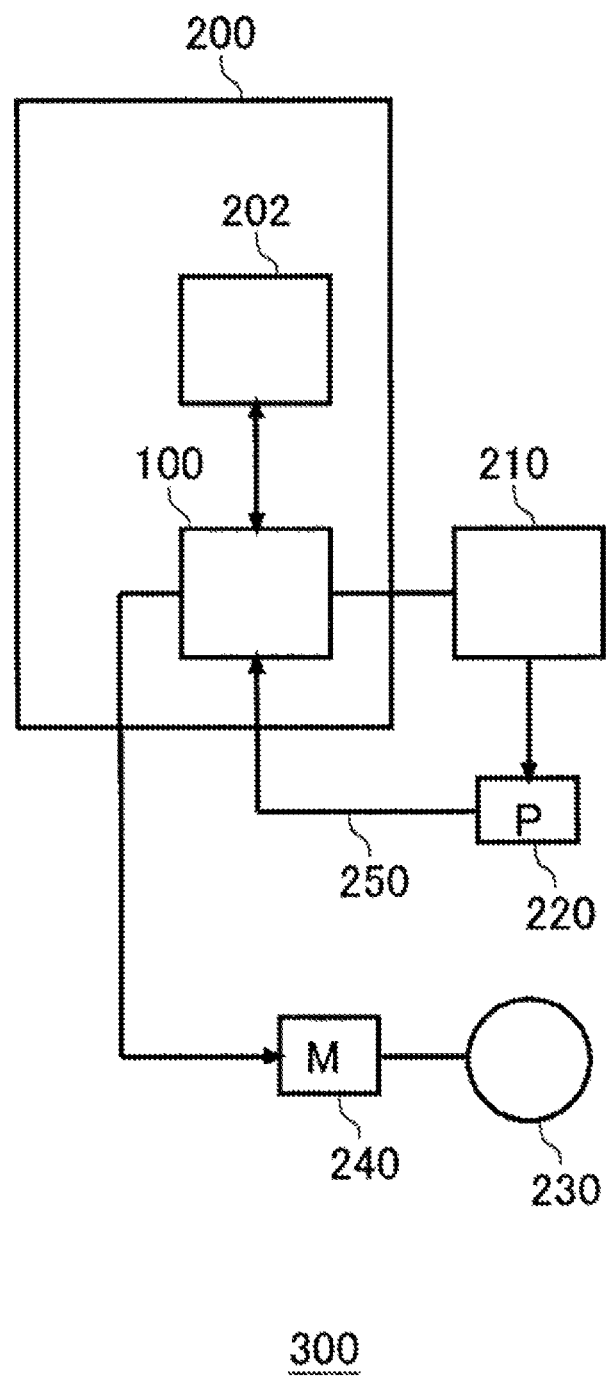
FIG. 16 is a block diagram showing one example of a structure of an electric vehicle 300.

FIG. 16 is a block diagram showing one example of a structure of an electric vehicle 300. The electric vehicle 300 comprises a power control unit 200, a motor 240 and a wheel 230.

The motor 240 rotates the wheel 230 by the electrical power to be supplied from the power control unit 200. The power control unit 200 comprises the CPU 202 and the semiconductor module 100. The semiconductor module 100 of the present example comprises a three-phase power conversion circuit that drives the motor 240.

The CPU 202 controls the semiconductor module 100 according to, for example, an operation of a control device by a driver. The semiconductor module 100 supplies to the motor 240 the electrical power according to the control by the CPU 202.

The electric vehicle 300 may further comprise a heat exchanger 210, a pump 220 and piping 250. The pump 220 supplies a refrigerant to the semiconductor module 100 through the piping 250. The heat exchanger 210 cools the refrigerant received from the semiconductor module 100 and then supplies the resultant to the pump 220. Since the power control unit 200 and the electric vehicle 300 of the present example use the semiconductor module 100 with good heat dissipation efficiency, a temperature rise of the semiconductor module 100 can be suppressed. Thus, the heat exchanger 210, the pump 220 and the piping 250 can be downsized. In addition to the motor 240, the electric vehicle 300 may comprise an engine that drives the wheel 230.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor module comprising:
   a plurality of semiconductor chips;
   a lead frame that is connected to the plurality of semiconductor chips; and
   a main terminal that is connected to the lead frame;
   wherein the lead frame has:
      an electrical connection portion that electrically connects the plurality of semiconductor chips to the main terminal; and
      a heat dissipation portion that is provided to extend from the electrical connection portion, wherein
   the electrical connection portion has a first plate-shaped portion that: is connected to the main terminal; and has a longitudinal direction in a direction from the main terminal toward the plurality of semiconductor chips,
   the electrical connection portion further has a plurality of chip connection portions that connects the plurality of semiconductor chips to the first plate-shaped portion, and
   a thickness of the plurality of chip connection portions are each less than or equal to one half of a thickness of the first plate-shaped portion to create a springiness therebetween.

2. The semiconductor module according to claim 1, wherein the heat dissipation portion does not extend a path of a current that flows between the main terminal and the plurality of semiconductor chips.

3. The semiconductor module according to claim 1, wherein the heat dissipation portion has a vertically extending portion that extends in an upward direction or a downward direction with respect to a main surface of the first plate-shaped portion.

4. The semiconductor module according to claim 3, wherein
   the heat dissipation portion has one or more second plate-shaped portions provided at a height that is different from that of the first plate-shaped portion,
   at least one of the second plate-shaped portions has a main surface facing the main surface of the first plate-shaped portion, and
   the vertically extending portion connects the first plate-shaped portion to the second plate-shaped portion.

5. The semiconductor module according to claim 3, wherein
   the heat dissipation portion has one or more second plate-shaped portions provided at a height that is different from that of the first plate-shaped portion,
   at least one of the second plate-shaped portions has a main surface that is inclined to the main surface of the first plate-shaped portion, and
   the vertically extending portion connects the first plate-shaped portion to the second plate-shaped portion.

6. The semiconductor module according to claim 1, wherein
   the electrical connection portion further has a plurality of chip connection portions that connects the plurality of semiconductor chips to the first plate-shaped portion.

7. The semiconductor module according to claim 4, wherein each of the electrical connection portion and the heat dissipation portion has one or more plate-shaped portions arranged at different heights, and an interval between an uppermost plate-shaped portion and a second uppermost plate-shaped portion below the uppermost plate-shaped portion is larger than an interval between any other pair of adjacent plate-shaped portions.

8. The semiconductor module according to claim 4, wherein each of the electrical connection portion and the heat dissipation portion has one or more plate-shaped portions arranged at different heights, and an uppermost plate-shaped portion is thinner than any other plate-shaped portions.

9. The semiconductor module according to claim 4, wherein each of the electrical connection portion and the heat dissipation portion has one or more plate-shaped portions arranged at different heights, and a through hole is formed in any of the plate-shaped portions.

10. The semiconductor module according to claim 3, wherein a through hole is formed at the vertically extending portion.

11. The semiconductor module according to claim 1, wherein the lead frame includes at least two bonded metal members.

12. An electric vehicle comprising the semiconductor module according to claim 1.

13. A power control unit comprising the semiconductor module according to claim 1.

* * * * *